(12) United States Patent
Seo et al.

(10) Patent No.: US 10,109,811 B2
(45) Date of Patent: Oct. 23, 2018

(54) FLEXIBLE DISPLAY AND METHOD OF MANUFACTURING THE SAME

(71) Applicant: Samsung Display Co., Ltd., Yongin-si, Gyeonggi-do (KR)

(72) Inventors: Taean Seo, Yongin-si (KR); Kihyun Kim, Yongin-si (KR); Jinhwan Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/795,117

(22) Filed: Oct. 26, 2017

(65) Prior Publication Data

US 2018/0047921 A1  Feb. 15, 2018

Related U.S. Application Data

(63) Continuation of application No. 14/958,614, filed on Dec. 3, 2015, now Pat. No. 9,806,272.

(30) Foreign Application Priority Data

Jun. 10, 2015  (KR) .................. 10-2015-0081983

(51) Int. Cl.
*H01L 51/56* (2006.01)
*H01L 51/00* (2006.01)
*H01L 51/52* (2006.01)

(52) U.S. Cl.
CPC ........ *H01L 51/0097* (2013.01); *H01L 51/003* (2013.01); *H01L 51/5253* (2013.01); *H01L 51/56* (2013.01)

(58) Field of Classification Search
CPC ... H01L 51/003; H01L 51/0097; H01L 51/56; H01L 51/5253
See application file for complete search history.

(56) References Cited

U.S. PATENT DOCUMENTS

| | | |
|---|---|---|
| 2008/0176477 A1 | 7/2008 | Hwang et al. |
| 2011/0171584 A1 | 7/2011 | Suh et al. |
| 2014/0299848 A1 | 10/2014 | Kim et al. |
| 2015/0333221 A1 | 11/2015 | Bibl et al. |
| 2016/0044777 A1 | 2/2016 | Seong et al. |

FOREIGN PATENT DOCUMENTS

| | | |
|---|---|---|
| KR | 10-2008-0098995 A | 11/2008 |
| KR | 10-2009-0009335 A | 1/2009 |
| KR | 10-2011-0042899 A | 4/2011 |
| KR | 10-2011-0082415 A | 7/2011 |
| KR | 10-2014-0120510 A | 10/2014 |

*Primary Examiner* — Douglas Menz
(74) *Attorney, Agent, or Firm* — Lewis Roca Rothgerber Christie LLP

(57) ABSTRACT

A flexible display and a method of manufacturing the same are disclosed. In one aspect, the method includes forming a sacrificial layer on a support substrate, wherein the sacrificial layer includes a plurality of patterns continuously formed thereon and a plurality of grooves formed between the patterns. The method also includes forming a display unit on the sacrificial layer, dissolving and removing the sacrificial layer with water and separating the display unit from the support substrate.

18 Claims, 12 Drawing Sheets

FLEXIBLE DISPLAY AND METHOD OF MANUFACTURING THE SAME

CROSS-REFERENCE TO RELATED APPLICATION

This application is a continuation of U.S. patent application Ser. No. 14/958,614, filed Dec. 3, 2015, which claims priority under 35 U.S.C. 119 of Korean Patent Application No. 10-2015-0081983, filed on Jun. 10, 2015, in the Korean Intellectual Property Office, the disclosures of which are incorporated by reference herein in their entireties.

BACKGROUND

Field

The described technology generally relates to a flexible display and a method of manufacturing the same.

Description of the Related Technology

Recently, as a result of significant market demand for flexible displays, active research has been focused on improvements to the technology. A flexible substrate, such as composite resin, is used rather than a glass substrate to realize the flexible capability of such a display. However, there have been problems associated with care in handling of the substrate during manufacturing. Accordingly, in order to solve these problems, the flexible substrate is formed on a (rigid) support substrate. After various thin film processes are performed, the flexible substrate is separated from the support substrate.

However, in conventional manufacturing, manufacturing costs increase, because the plastic substrate is flexible, and self-emitting diodes are damaged when laser is used during separation.

Information disclosed in this Background section was already known to the inventors before achieving the inventive concept or is technical information acquired in the process of achieving the inventive concept. Therefore, it may contain information that does not form the prior art that is already known to the public.

SUMMARY OF CERTAIN INVENTIVE ASPECTS

One inventive aspect relates to a flexible display simplified in a structure and a manufacturing process, and a manufacturing method thereof.

Another aspect is a flexible display simplified in a structure and a manufacturing process, and a manufacturing method thereof that solves the above and other problems.

Another aspect is a manufacturing method of a flexible display apparatus that includes forming on a support substrate a sacrificial layer having patterns continuously formed thereon and grooves formed between the patterns, forming on the sacrificial layer a display unit to realize an image, dissolving and removing the sacrificial layer by using water, and separating the display unit and the support substrate.

In the forming the sacrificial layer, the sacrificial layer may include molybdenum and oxygen.

In the forming the sacrificial layer, the patterns may include a shape of a polygon, a circle, or an ellipse which is continuously formed thereon.

The forming the display unit may include forming on the sacrificial layer a barrier layer including an inorganic compound, forming a semiconductor layer on the barrier layer, and forming a light-emitting device to be electrically connected to the semiconductor layer.

In the forming the barrier layer, at least a portion of the barrier layer may contact the support substrate through the grooves formed in the sacrificial layer.

The separating the display unit and the support substrate may include separating the barrier layer and the support substrate.

The sacrificial layer may include an upper surface contacting the barrier layer and a lower surface contacting the support substrate, the barrier layer may include a first surface contacting the sacrificial layer and a second surface disposed opposite to the first surface, and the first surface of the barrier layer separated from the support substrate may be formed to correspond to the upper surface of the sacrificial layer.

The first surface of the barrier layer may include protrusion portions and recess portions which are continuously formed thereon.

The manufacturing method may further include attaching a protection film to the first surface of the barrier layer after the separating the display unit and the support substrate.

The protrusion portions may contact the protection film.

A separation space may be formed in the recess portions between the first surface of the barrier layer and the protection film.

A residual of the sacrificial layer may exist in the recess portions of the barrier layer.

Another aspect is a flexible display apparatus that includes a barrier layer having a first surface continuously formed with protrusion portions and recess portions and a second surface disposed opposite to the first surface, a thin film transistor formed on the second surface of the barrier layer, and an organic light-emitting device electrically connected to the thin film transistor.

A material including molybdenum and oxygen may be disposed in at least a portion of the recess portions.

The flexible display apparatus may further include a protection film formed on the first surface of the barrier layer, and the protection film may contact the protrusion portions.

A separation space may be formed in the recess portions between the first surface of the barrier layer and the protection film.

The barrier layer may include an inorganic compound.

Another aspect is a method of manufacturing a flexible display, the method comprising: forming a sacrificial layer on a support substrate, wherein the sacrificial layer includes a plurality of patterns continuously formed thereon and a plurality of grooves formed between the patterns; forming a display unit on the sacrificial layer; dissolving and removing the sacrificial layer with water; and after removal of the sacrificial layer, separating the display unit from the support substrate.

In the above method, the sacrificial layer comprises molybdenum and oxygen. In the above method, each of the patterns has a shape of a polygon, a circle, or an ellipse. In the above method, the forming of the display unit comprises: forming on the sacrificial layer a barrier layer including an inorganic compound; forming a semiconductor layer on the barrier layer; and forming a light-emitting device to be electrically connected to the semiconductor layer. In the above method, at least a portion of the barrier layer contacts the support substrate through the grooves formed in the sacrificial layer. In the above method, the separating comprises separating the barrier layer from the support substrate. In the above method, the sacrificial layer comprises an upper surface contacting the barrier layer and a lower surface contacting the support substrate, wherein the barrier layer comprises a first surface contacting the sacrificial layer and a second surface disposed opposite to the first surface, and wherein the first surface of the barrier layer separated from the support substrate corresponds to the upper surface of the sacrificial layer.

In the above method, the first surface of the barrier layer comprises a plurality of protrusion portions and a plurality of recess portions, which are continuously formed thereon. The above method further comprises: attaching a protection film to the first surface of the barrier layer after the separating. In the above method, the protrusion portions contact the protection film. In the above method, a separation space is formed in the recess portions between the first surface of the barrier layer and the protection film. In the above method, a residual of the sacrificial layer exists in the recess portions of the barrier layer.

Another aspect is a flexible display apparatus comprising: a barrier layer including first and second surfaces opposing each other, wherein a plurality of protrusion portions and a plurality of recess portions are continuously formed on the first surface; a thin film transistor formed on the second surface of the barrier layer; and an organic light-emitting device electrically connected to the thin film transistor.

In the above method, a material including molybdenum and oxygen is disposed in at least a portion of the recess portions. The above method further comprises: a protection film formed on the first surface of the barrier layer, wherein the protection film contacts the protrusion portions. In the above method, a separation space is formed in the recess portions between the first surface of the barrier layer and the protection film. In the above method, the barrier layer comprises an inorganic compound.

Another aspect is a method of manufacturing a flexible display, the method comprising: forming a sacrificial layer on a support substrate, wherein the sacrificial layer includes a plurality of protrusions and a plurality of grooves formed between the protrusions; forming a display unit on the sacrificial layer; removing the sacrificial layer; and separating the display unit from the support substrate.

In the above method, each of the protrusions has a shape of a polygon, a circle, or an ellipse. In the above method, the removing comprises dissolving the sacrificial layer with water.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION OF CERTAIN INVENTIVE EMBODIMENTS

Figure 1:
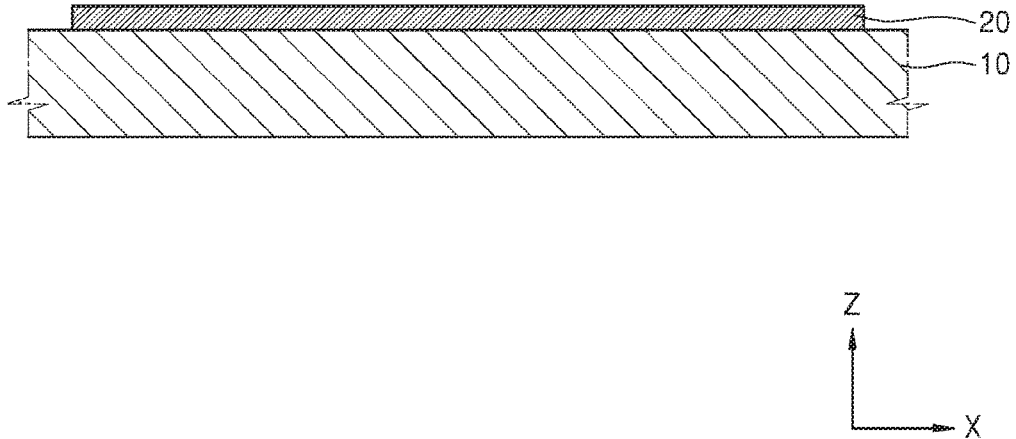
FIG. 1 is a cross-sectional view schematically illustrating a manufacturing method of a flexible display apparatus, according to an embodiment.

The present exemplary embodiments may have different forms and should not be construed as being limited to the descriptions set forth herein. Accordingly, the exemplary embodiments are merely described below, by referring to the figures, to explain aspects of the present description.

Reference will now be made in detail to exemplary embodiments, examples of which are illustrated in the accompanying drawings, wherein like reference numerals refer to like elements throughout.

It will be understood that although the terms "first", "second", etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. The term "connected" includes an electrical connection.

FIGS. 1 and 3 through 5 are cross-sectional views schematically illustrating a manufacturing method of a flexible display apparatus, according to an embodiment, and FIGS. 2A through 2E are plan views schematically illustrating embodiments of patterns of a sacrificial layer of FIG. 1.

Referring to FIG. 1, the manufacturing method includes providing a support substrate 10. The support substrate 10 may be a rigid element as a supporting body during the manufacturing process and may be glass, a metal, or an inorganic material, for example, ceramic.

Thereafter, a sacrificial layer 20 is formed on the support substrate 10. The sacrificial layer 20 may be metal oxide and may be a water-soluble material. In the present embodiment, the sacrificial layer 20 is a compound including molybdenum (Mo) and oxygen (O), for example, molybdenum oxide having a compound structure of MoOx.

The sacrificial layer 20 may be formed to have various patterns which are illustrated in FIGS. 2A through 2E. Sacrificial layers 20a, 20b, 20c, 20d, and 20e illustrated in FIGS. 2A through 2E, respectively, may have patterns repeatedly formed with straight lines or a curve, and grooves 20a', 20b', 20c', 20d' and 20e' may be formed between the patterns. Each pattern may include a protrusion. The grooves 20a'-20e' may be interposed or surround the protrusions.

Figure 2A:
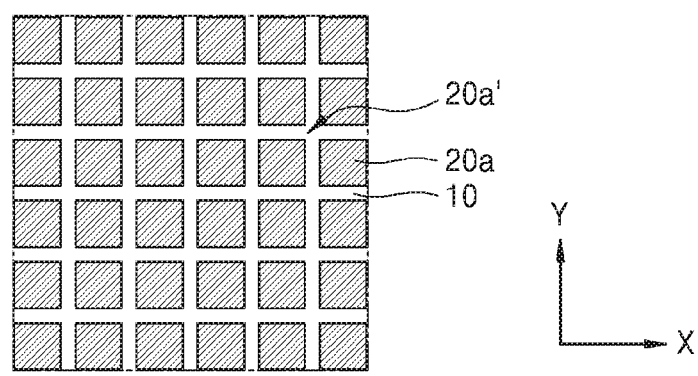
FIGS. 2A, 2B, 2C, 2D and 2E are plan views schematically illustrating embodiments of patterns of a sacrificial layer of FIG. 1.
Figure 2B:
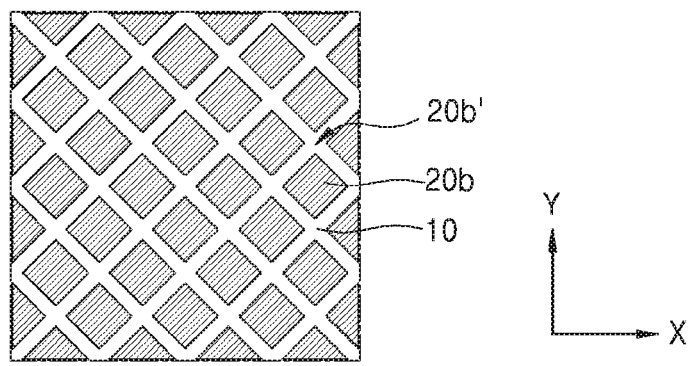
Figure 2C:
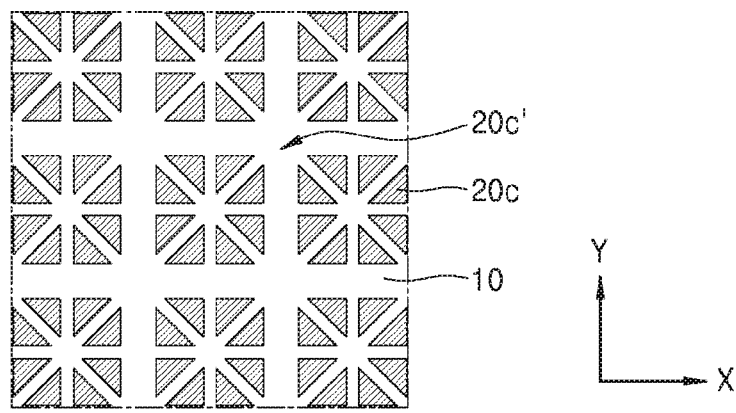
Figure 2D:
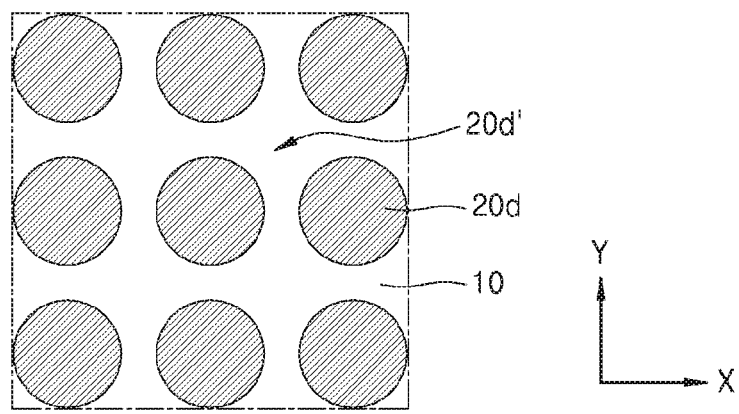
Figure 2E:
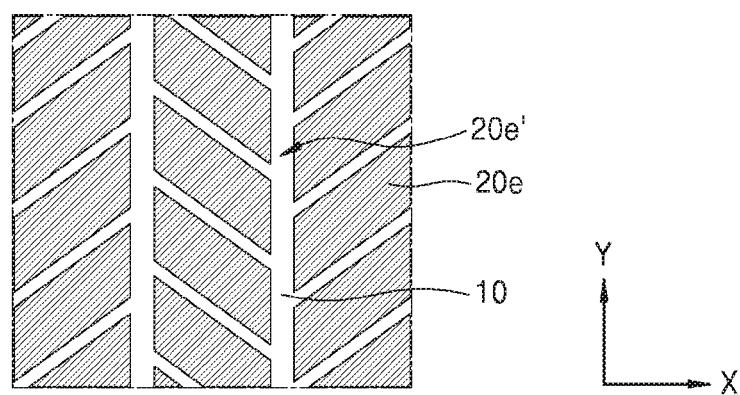

In some embodiments, square patterns are continuously arranged in the sacrificial layer 20a, and the grooves 20a' may be formed along a horizontal direction (X axis direction) and a vertical direction (Y axis direction), as illustrated in FIG. 2A. In another embodiment, rhombus patterns are continuously arranged in a diagonal direction to form the sacrificial layer 20b, and grooves 20b' are formed between the patterns of the sacrificial layer 20b, as illustrated in FIG. 2B. In another embodiment, triangular patterns are continuously arranged to form the sacrificial layer 20c, and the grooves 20c' are formed between the patterns of the sacrificial layer 20c, as illustrated in FIG. 2C. In another embodiment, circular patterns are continuously arranged to form the sacrificial layer 20d, and the grooves 20d' are formed between the patterns of the sacrificial layer 20d, as illustrated in FIG. 2D. In another embodiment, rectangular patterns, for example, a parallelogram, are continuously arranged to form the sacrificial layer 20e, and the grooves 20e' are formed between the patterns of the sacrificial layer 20e, as illustrated in FIG. 2E. Although the sacrificial layers 20a, 20b, 20c, 20d, and 20e with various patterns are illustrated in FIGS. 2A through 2E, for convenience of illustration, any shape may be formed as long as a groove is formed between patterns.

Figure 3:
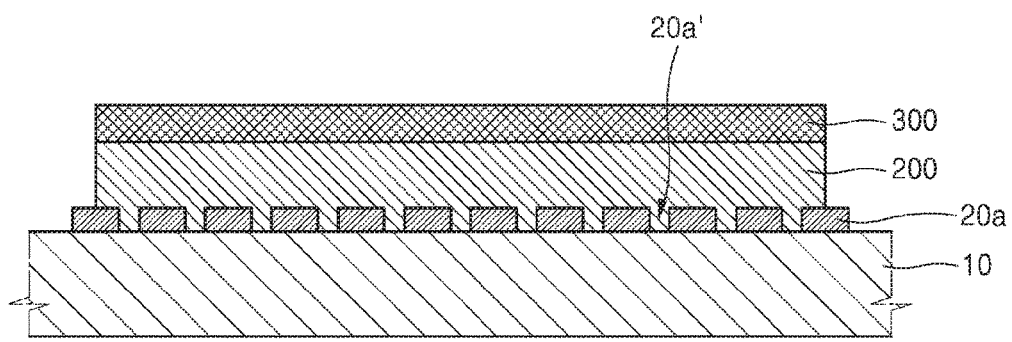
FIGS. 3, 4 and 5 are cross-sectional views schematically illustrating a manufacturing method of the flexible display apparatus of FIG. 1.

Referring to FIG. 3, a display unit 200 is formed on the patterned sacrificial layer 20a to realize an image. The display unit 200 may include a thin film transistor (TFT) and a light-emitting device electrically connected to the TFT. The light-emitting device may be a liquid crystal device or an organic light-emitting device. The present embodiment illustrates the flexible display apparatus provided with the organic light-emitting device. A detail structure of the display unit 200 will be described later with reference to FIG. 6.

After the display unit 200 is formed, an encapsulation unit 300 may be formed on the display unit 200. Although not illustrated, the encapsulation unit 300 may be a multilayer structure stacked with more than one inorganic layer and an organic layer. The encapsulation unit 300 may seal the display unit 200 from the environment to prevent damage to the display unit by water and oxygen.

Figure 4:
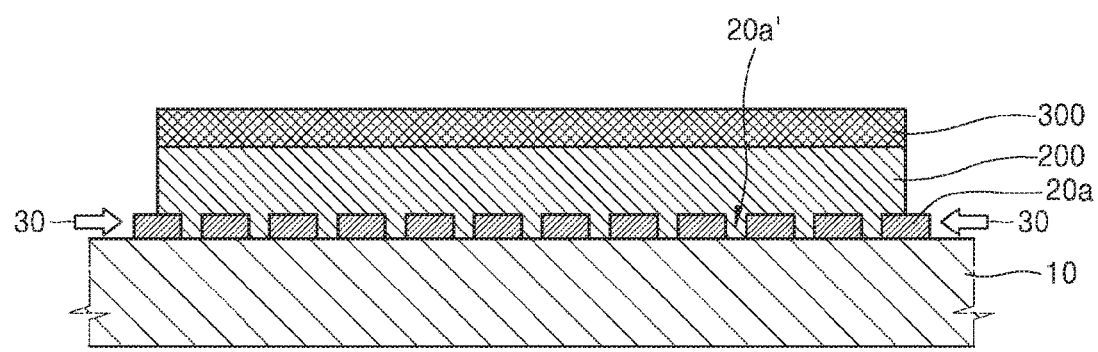
Figure 5:
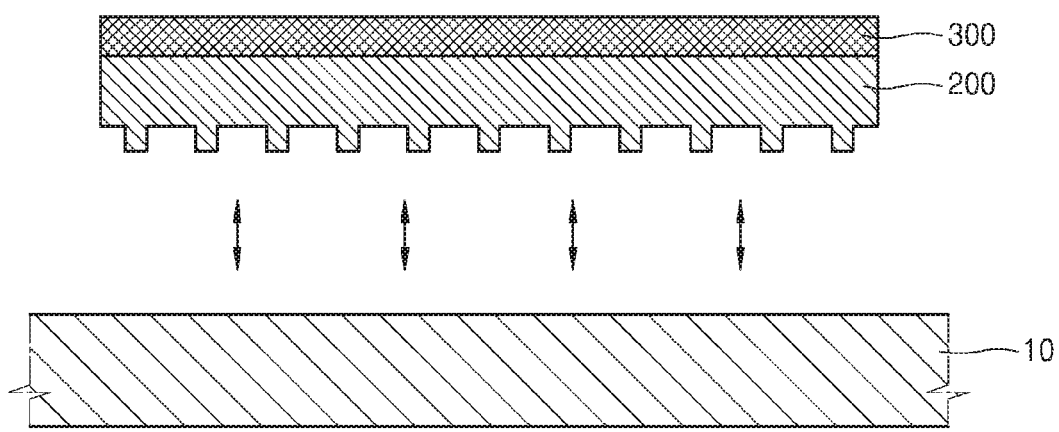

Referring to FIG. 4, the patterned sacrificial layer 20a may be removed by using an enchant 30. The removal of the patterned sacrificial layer 20a by the enchant 30 may include dissolving the patterned sacrificial layer 20a by water. As described above, in some embodiments, since the sacrificial layer 20a is molybdenum oxide having solubility by water, the sacrificial layer 20a may be dissolved by instilling water into the sacrificial layer 20a. The sacrificial layer 20a may be removed by dipping the sacrificial layer 20a into a water tank filled with water, and various methods may be usable. During a process of dissolving the sacrificial layer 20a, the sacrificial layer 20a may be effectively removed because paths of the enchant 30 to permeate between the patterned sacrificial layer 20a are increased.

After the sacrificial layer 20a is dissolved by water, the display unit 200 is separated from the support substrate 10. A lower side of the display unit 200 separated from the sacrificial layer 20a may be formed to have a curve according to the patterns of the sacrificial layer 20a.

Conventionally, laser lift-off (LLO) is used to separate a display unit from a support substrate. Like this, if detachment is performed after laser scanning using a laser apparatus, cost of loss is increased and a manufacturing cost of a final product is increased due to an increase in maintenance fees of the laser apparatus. Also, there exist problems that productivity is lowered due to a long laser-scanning time for entire irradiation of a laser beam of the laser apparatus, and a manufacturing yield is decreased due to damage to components of the display unit by the laser scanning. Also, there are further problems that a manufacturing cost is increased and flexibility is reduced by a thickness of the flexible substrate since a flexible substrate, for example, a polyimide (PI) substrate, has to be formed for the laser scanning.

Accordingly, according to the present embodiment, a laser apparatus is not used. However, the sacrificial layer 20a may be effectively dissolved by forming the water-soluble sacrificial layer 20a dissolvable by water and increasing a contact area with the water by forming grooves between patterns when the sacrificial layer 20a is patterned. Moreover, the manufacturing costs may be lowered since a laser apparatus is not used and a flexible substrate is not provided, and flexibility may be more improved by reducing an entire thickness of the flexible display apparatus.

Figure 6:
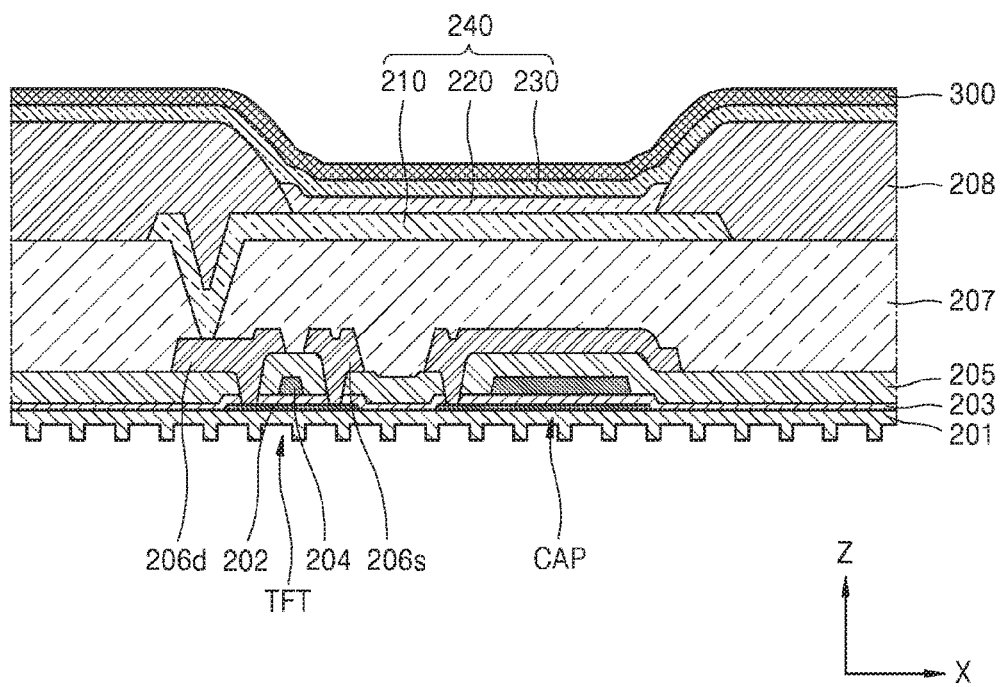
FIG. 6 is a cross-sectional view schematically illustrating a flexible display apparatus according to an embodiment.

FIG. 6 is a cross-sectional view schematically illustrating a flexible display apparatus according to an embodiment. In FIG. 6, a structure of the display unit 200 will be described in detail hereinafter.

Before the display unit 200 is formed, a barrier layer 201 including an inorganic compound is formed on the sacrificial layer 20a. The barrier layer 201 can prevent introduction of impurities into the TFT or an organic light-emitting device (e.g., an OLED) 240 included in the display unit 200. The barrier layer 201 may be a single layer or a multilayer including a material, such as silicon oxide or silicon nitride.

The barrier layer 201 can be directly disposed on the patterned sacrificial layer 20a and formed to have a curve that corresponds to an upper surface of patterns of the sacrificial layer 20a, as illustrated in FIG. 6, after being separated from the sacrificial layer 20a. In the drawing, an uneven pattern having the curve is formed on a lower surface of the barrier layer 201 directly contacting the sacrificial layer 20a. Although an upper surface of the barrier layer 201, on which a semiconductor layer 220 (which will be described later) is disposed, is illustrated as flat, the entire barrier layer 201 may be formed to have the curve according to the patterns of the sacrificial layer 20a depending on a size of the patterns of the sacrificial layer 20a. In this case, another barrier layer may be formed on the barrier layer 201 so that the TFT is formed on a flattened surface.

Meanwhile, the sacrificial layer 20a may have an upper surface and a lower surface. The upper surface of the sacrificial layer 20a contacts the barrier layer 201 and the lower surface of the sacrificial layer 20a contacts the support substrate 10. The barrier layer 201 may have a first surface contacting the upper surface of the sacrificial layer 20a and a second surface disposed opposite to the first surface. Here, the first surface of the barrier layer 201 contacting the upper surface of the sacrificial layer 20a may be formed to correspond to the upper surface of the sacrificial layer 20a. Accordingly, as illustrated in FIG. 6, the first surface of the barrier layer 201 may be formed to have the uneven pattern with the curve to correspond to the upper surface of the sacrificial layer 20a after being separated from the support substrate 10.

The TFT and a capacitor CAP may be formed on the barrier layer 20a, and the organic light-emitting device 240 may be disposed to be electrically connected to the TFT. The TFT may include the semiconductor layer 202 including amorphous silicon, polycrystalline silicon or organic semiconductor material, a gate electrode 204, a source electrode 206s, and a drain electrode 206d. A general structure of the TFT will be explained in detail below.

As described above, the barrier layer 201 including silicon oxide or silicon nitride as described above is disposed to flatten a surface, on which the TFT is formed, and to prevent introduction of impurities into the semiconductor layer 202 of the TFT, and then the semiconductor layer 202 may be formed on the barrier layer 201.

The gate electrode 204 is formed on an upper side of the semiconductor layer 202, and the source electrode 206s and the drain electrode 206d electrically communicate with each other according to a signal applied to the gate electrode 204. Considering adhesiveness with an adjacent layer, surface flatness of a layer to be stacked, and workability, the gate electrode 204 may be a single layer or a multilayer including at least one material among aluminum (Al), platinum (Pt), palladium (Pd), silver (Ag), magnesium (Mg), gold (Au), Nickel (Ni), Neodymium (Nd), indium (Ir), chromium (Cr), lithium (Li), calcium (Ca), molybdenum (Mo), titanium (Ti), tungsten (W), and Copper (Cu), for example.

Here, a gate insulation layer 203 including silicon oxide and/or silicon nitride may be disposed between the semiconductor layer 202 and the gate electrode 204 to provide insulation between the semiconductor layer 202 and the gate electrode 204.

An interlayer insulation layer 205 may be formed on the gate electrode 204 and may be a single layer or a multilayer including a material, such as silicon oxide or silicon nitride.

The source electrode 206s and the drain electrode 206d are formed on the interlayer insulation layer 205. The source electrode 206s and the drain electrode 206d are electrically connected to the semiconductor layer 202 through a contact hole formed in the gate insulation layer 203 and the interlayer insulation layer 205. Considering conductivity, the source electrode 206s and the drain electrode 206d may be a single layer or a multilayer including at least one material among aluminum (Al), platinum (Pt), palladium (Pd), silver (Ag), magnesium (Mg), gold (Au), Nickel (Ni), Neodymium (Nd), indium (Ir), chromium (Cr), lithium (Li), calcium (Ca), molybdenum (Mo), titanium (Ti), tungsten (W), and Copper (Cu), for example.

Meanwhile, although not illustrated in the drawings, a protection layer (not illustrated) may be formed to cover the TFT to protect such a structure of the TFT. The protection layer may be an inorganic compound such as silicon oxide, silicon nitride, or silicon oxynitride.

Meanwhile, a first insulation layer 207 may be formed to cover the TFT. In this case, the first insulation layer 207 may be a planarization layer or a protection layer. The first insulation layer 207 may flatten an upper surface of the TFT when the organic light-emitting device is disposed on the TFT, and also protect the TFT and various elements. The first insulation layer 207 may include an acrylic organic compound or benzocyclobutene (BCB). Here, the barrier layer 201, the gate insulation layer 203, the interlayer insulation layer 205, and the first insulation layer 207 may be formed on the entire area of the display unit 200.

Meanwhile, after the first insulation layer 207 is formed, a second insulation layer 208 may be formed. In this case, the second insulation layer 208 may be a pixel-defining layer. The second insulation layer 208 may be disposed on the above-described first insulation layer 207 and may have an opening. The second insulation layer 208 may define a pixel area.

The second insulation layer 208 may be an organic insulation layer. The organic insulation layer may include acrylic polymer such as poly(methyl methacrylate) (PMMA), polystyrene (PS), a polymer derivative having a phenol group, imide polymer, acryl ester-based polymer, amide-based polymer, fluorine-based polymer, p-xylene polymer, vinyl alcohol polymer, and a mixture thereof.

Meanwhile, the organic light-emitting device 240 may be formed on the second insulation layer 208. The organic light-emitting device 240 may include a pixel electrode 210, an intermediate layer 220 having an emission layer EML, and an opposite electrode 230.

Before the second insulation layer 208 is formed, the pixel electrode 210 may be formed on the first insulation layer 207 after the first insulation layer 207 is formed. The pixel electrode 210 may be a semi-transparent electrode or a reflective electrode. When the semi-transparent electrode is formed as the pixel electrode 210, it may be indium tin oxide (ITO), indium zinc oxide (IZO), zinc oxide (ZnO), indium oxide ($In_2O_3$), indium gallium oxide (IGO) or aluminum zinc oxide (AZO). When the reflective electrode is formed as the pixel electrode 210, it may include a reflective layer having silver (Ag), magnesium (Mg), aluminum (Al), platinum (Pt), palladium (Pd), gold (Au), Nickel (Ni), Neodymium (Nd), Iridium (Jr), chromium (Cr), and a mixture thereof, and a layer including indium tin oxide (ITO), indium zinc oxide (IZO), zinc oxide (ZnO), indium oxide ($In_2O_3$), indium gallium oxide (IGO), or aluminum zinc oxide AZO. The present inventive concept is not limited thereto. Various materials may be usable, and a structure thereof may be variously changed to, for example, a single layer or a multilayer.

After the pixel electrode 210 is formed, the second insulation layer 208 may be formed to cover a boundary of the pixel electrode 210. The intermediate layer 220 may be formed on a pixel area defined by the second insulation layer 208. The intermediate layer 220 may include an emission layer EML that emits light according to an electrical signal. In addition to the emission layer EML, the intermediate layer 220 may be a single layer or a complex structure including a hole injection layer HIL disposed between the emission layer EML and the pixel electrode 210, a hole transport layer HTL, and an electron transport layer ETL disposed between the emission layer EML and the opposite electrode 230, or an electron injection layer. However, the intermediate layer 220 is not limited thereto, and may have various structures.

The opposite electrode 230 covering the intermediate layer 220 including the emission layer EML and disposed opposite to the pixel electrode 210 may be formed on an entire area of the display unit 200. The opposite electrode 230 may be a (semi-) transparent electrode or a reflective electrode. If the opposite electrode 230 includes a semi-transparent electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof, and a (semi-) transparent conductive layer of indium tin oxide (ITO), indium zinc oxide (IZO), zinc oxide (ZnO) or indium oxide ($In_2O_3$). If the opposite electrode 230 includes a reflective electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof. However, a structure and a material of the opposite electrode 230 are not limited thereto, and they may be changeable variously.

Meanwhile, the encapsulation unit 300 may be further formed on the display unit 200 to seal the display unit 200 from outside. Although not illustrated in the drawings, the encapsulation unit 300 may be a multilayer including at least one inorganic layer and an organic layer. The inorganic layer and the organic layer may be alternately stacked.

Figure 7:
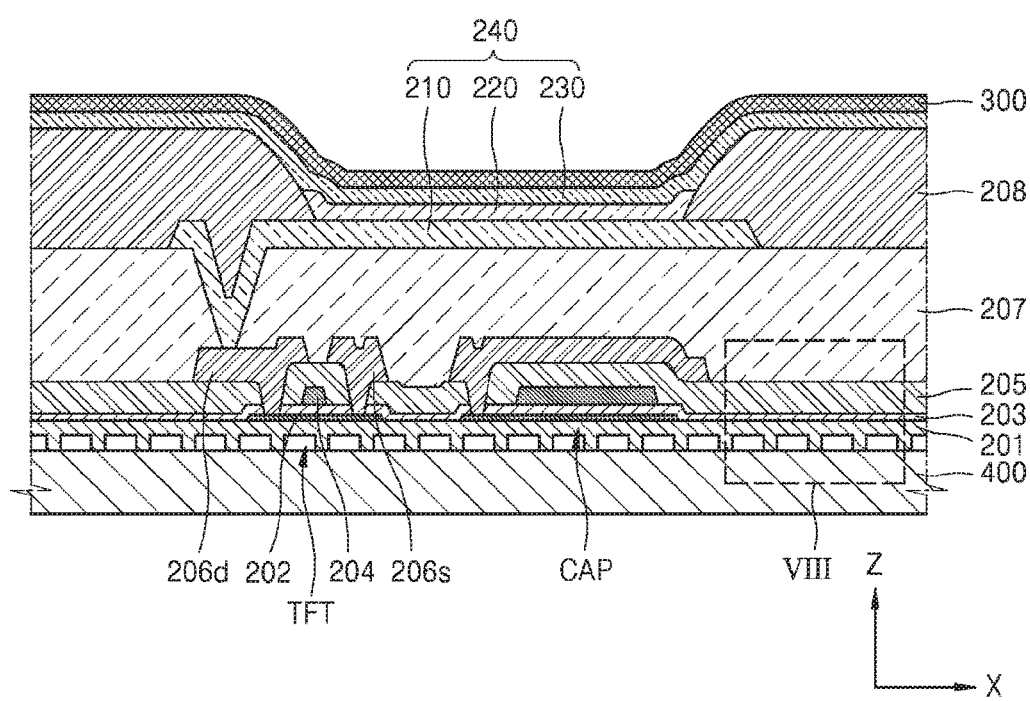
FIG. 7 is a cross-sectional view schematically illustrating a flexible display apparatus according to an embodiment.
Figure 8:
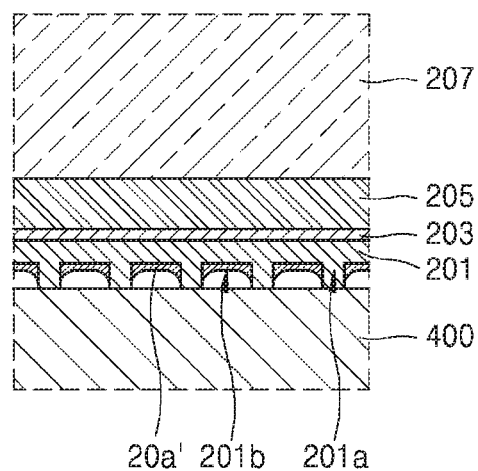
FIG. 8 is an enlarged cross-sectional view of a portion VIII of the flexible display apparatus of FIG. 7.

FIG. 7 is a cross-sectional view schematically illustrating a flexible display apparatus according to an embodiment, and FIG. 8 is an enlarged view of a portion VIII of the flexible display apparatus of FIG. 7.

Referring to FIG. 7, a protection film 400 may be additionally attached to the first surface of the barrier layer 201. The protection film 400 may have flexibility and a plastic material such as polyethylene terephthalate (PET), polyethylene naphthalate (PEN), and polyimide. The protection film 400 protects the display unit 200 from outside and may be removed later if necessary.

Referring to FIG. 8, the first surface of the barrier layer 201 may be continuously formed with protrusion portions 201a and recess portions 201b. The protrusion portions 201a and the recess portions 201b are formed according to the patterns of the sacrificial layer 20a. That is, the recess portions 201b are formed in areas where the patterns of the sacrificial layer 20a exist, and the protrusion portions 201a are formed in areas where the patterns of the sacrificial layer 20a do not exist, that is, where the grooves existed. The protrusion portions 201a of the barrier layer 201 may be formed to directly contact the protection film 400. A separation space may be formed in the recess portions 201b between the protection film 400 and the first surface of the barrier layer 201.

Meanwhile, a residual of the sacrificial layer 20a may exist in the recess portions 201b of the barrier layer 201. Although the sacrificial layer 20a includes a water-soluble material according to the present embodiment, the sacrificial layer 20a disposed in the recess portions 201b of the barrier layer 201 may not be completely removed.

Although the manufacturing method of the flexible display apparatus is explained above, the described technology is not limited thereto. For example, any flexible display apparatus manufactured according to the above-described manufacturing method may be within the scope of the present inventive concept.

The flexible display apparatus according to an embodiment will be explained with reference to FIGS. 7 and 8.

The display unit 200 may be formed on the protection film 400. The protection film 400 may be attached thereto after the display unit 200 has been detached from the support substrate 10. The protection film 400 protects the display unit 200 and may be removed later if necessary.

The display unit 200 may include the barrier layer 201. The barrier layer 201 may be formed to prevent impurities from being introduced into the TFT and the organic light-emitting device included in the display unit 200. The barrier layer 201 may include an inorganic compound such as silicon oxide or silicon nitride. The barrier layer 201 may include the first surface contacting the protection film 400 and the second surface disposed opposite to the first surface. The first surface of the barrier layer 201 may have an uneven pattern formed with a curve.

Although the second surface of the barrier layer 201 on which the semiconductor layer 202 is disposed is illustrated as flat, the entire barrier layer 201 may have a curve to correspond to the patterns of the sacrificial layer 20a according to a dimension of the patterns of the sacrificial layer 20a. In this case, an additional barrier layer may be formed on the barrier layer 201 to form a flattened surface on which the TFT is formed.

The TFT and the capacitor CAP may be formed on the barrier layer 201, and the organic light-emitting device 240 may be disposed to be electrically connected to the TFT. The TFT may include the semiconductor layer 202 includes amorphous silicon, polycrystalline silicon or organic semiconductor material, a gate electrode 204, a source electrode 206s, and a drain electrode 206d. In explaining a general structure of the TFT below, the above described manufacturing method will be invoked regarding duplicate descriptions thereof.

The barrier layer 201 is arranged to flatten a surface, on which the TFT is formed, and to prevent introduction of impurities into the semiconductor layer 202 of the TFT, and then the semiconductor layer 202 may be formed on the barrier layer 201.

The gate electrode 204 is formed on the upper side of the semiconductor layer 202, and the source electrode 206s and the drain electrode 206d electrically communicate with each other according to a signal applied to the gate electrode 204. Here, a gate insulation layer 203 including silicon oxide and/or silicon nitride may be disposed between the semiconductor layer 202 and the gate electrode 204 to provide insulation between the semiconductor layer 202 and the gate electrode 204.

The interlayer insulation layer 205 may be formed on an upper side of the gate electrode 204, and the source electrode 206s and the drain electrode 206d are formed on the interlayer insulation layer 205. The source electrode 206s and the drain electrode 206d are electrically connected to the semiconductor layer 202 through the contact hole formed in the gate insulation layer 203 and the interlayer insulation layer 205.

Meanwhile, the first insulation layer 207 may be formed to cover the TFT. In this case, the first insulation layer 207 may be a planarization layer or a protection layer. The first insulation layer 207 may flatten an upper surface of the TFT when the organic light-emitting device is disposed on the TFT, and also protect the TFT and various elements.

Meanwhile, after the first insulation layer 207 has been formed, the second insulation layer 208 may be formed. In this case, the second insulation layer 208 may be a pixel-defining layer. The second insulation layer 208 may be disposed on the above-described first insulation layer 207 and may have an opening. The second insulation layer 208 may define a pixel area.

Meanwhile, the organic light-emitting device 240 may be formed on the second insulation layer 208. The organic light-emitting device 240 may include a pixel electrode 210, an intermediate layer 220 having an emission layer EML, and an opposite electrode 230. The above-described descriptions are invoked regarding duplicate descriptions of the organic light-emitting device 249.

Meanwhile, the encapsulation unit 300 may be further formed on the display unit 200 to seal the display unit 200 from outside. Although not illustrated in the drawings, the encapsulation unit 300 may be a multilayer including at least one inorganic layer and an organic layer. The inorganic layer and the organic layer may be alternately stacked.

As illustrated in FIG. 8, the first surface of the barrier layer 201 may be continuously formed with protrusion portions 201a and recess portions 201b. The protrusion portion 201a and the recess portion 201b are formed according to the patterns of the sacrificial layer 20a. That is, the recess portions 201b are formed in areas where the patterns of the sacrificial layer 20a existed, and the protrusion portions 201a are formed in areas where the patterns of the sacrificial layer 20a do not exist, that is, where the grooves exist. The protrusion portions 201a of the barrier layer 201 may be formed to directly contact the protection film 400. A separation space may be formed in the recess portions 201b between the protection film 400 and the first surface of the barrier layer 201.

Meanwhile, a residual of the sacrificial layer 20a may exist in the recess portions 201b of the barrier layer 201. The sacrificial layer 20a may include metal oxide or a water-soluble material. In the present embodiment, the sacrificial layer 20s may be a compound including molybdenum Mo and oxygen O, that is, the sacrificial layer 20 may have a compound structure of MoOx as molybdenum oxide. Although the sacrificial layer 20a includes a water-soluble material according to the present embodiment, the sacrificial layer 20a disposed in the recess portions 201b of the barrier layer 201 may not be completely removed.

Conventionally (not necessarily prior art), a laser lift off (LLO) is used to separate a display unit from a support substrate. Like this, if detachment is performed after laser scanning using a laser apparatus, the cost of loss is increased and a manufacturing cost of a final product is increased due to an increase in maintenance fees of the laser apparatus. Also, there exist problems that productivity is lowered due to a long laser-scanning time for entire irradiation of a laser beam of the laser apparatus, and a manufacturing yield is decreased due to damage to components of the display unit by the laser scanning. Also, there are further problems that a manufacturing cost is increased and flexibility is reduced by a thickness of the flexible substrate since a flexible substrate, for example, a PI substrate, has to be formed for the laser scanning.

Accordingly, in the flexible display apparatus according to the present embodiment, a laser apparatus is not used. However, the sacrificial layer 20a may be effectively dissolved by forming the water-soluble sacrificial layer 20a dissolvable by water and increasing a contact area with water by forming the grooves between patterns when the sacrificial layer 20a is patterned. Moreover, the manufacturing costs may be lowered since a laser apparatus is not used and a flexible substrate is not provided, and flexibility may be more improved by reducing an entire thickness of the display apparatus.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A method of manufacturing a flexible display, the method comprising:
   forming a sacrificial layer on a support substrate, wherein the sacrificial layer includes a plurality of patterns continuously formed thereon and a plurality of grooves formed between the patterns, and wherein the sacrificial layer comprises molybdenum and oxygen;
   forming a display unit on the sacrificial layer;
   dissolving and removing the sacrificial layer with water; and
   separating the display unit from the support substrate.

2. The method of claim 1, wherein each of the patterns has a shape of a polygon, a circle, or an ellipse.

3. The method of claim 1, wherein the forming of the display unit comprises:
   forming on the sacrificial layer a barrier layer including an inorganic compound;
   forming a semiconductor layer on the barrier layer; and
   forming a light-emitting device to be electrically connected to the semiconductor layer.

4. The method of claim 3, wherein at least a portion of the barrier layer contacts the support substrate through the grooves formed in the sacrificial layer.

5. The method of claim 3, wherein the separating comprises separating the barrier layer from the support substrate.

6. The method of claim 5, wherein the sacrificial layer comprises an upper surface contacting the barrier layer and a lower surface contacting the support substrate, wherein the barrier layer comprises a first surface contacting the sacrificial layer and a second surface disposed opposite to the first surface, and wherein the first surface of the barrier layer separated from the support substrate corresponds to the upper surface of the sacrificial layer.

7. The method of claim 6, wherein the first surface of the barrier layer comprises a plurality of protrusion portions and a plurality of recess portions, which are continuously formed thereon.

8. The method of claim 7, further comprising:
   attaching a protection film to the first surface of the barrier layer after the separating.

9. The method of claim 8, wherein the protrusion portions contact the protection film.

10. The method of claim 9, wherein a separation space is formed in the recess portions between the first surface of the barrier layer and the protection film.

11. The method of claim 8, wherein a residual of the sacrificial layer exists in the recess portions of the barrier layer.

12. The method of claim 1, wherein the dissolving and removing comprises dipping the sacrificial layer into a water tank filled with water.

13. The method of claim 1, wherein dissolving and removing the sacrificial layer with water comprises at least a portion of the sacrificial layer remaining on one side of the display unit.

14. A method of manufacturing a flexible display, the method comprising:
   forming a sacrificial layer on a support substrate, wherein the sacrificial layer includes a plurality of protrusions and a plurality of grooves formed between the protrusions, and wherein the sacrificial layer comprises molybdenum and oxygen;
   forming a display unit on the sacrificial layer;
   removing the sacrificial layer with water; and
   separating the display unit from the support substrate.

15. The method of claim 14, wherein each of the protrusions has a shape of a polygon, a circle, or an ellipse.

16. The method of claim 14, wherein the removing comprises dissolving the sacrificial layer with water.

17. The method of claim 14, wherein the removing comprises dipping the sacrificial layer into a water tank filled with water.

18. The method of claim 14, wherein dissolving and removing the sacrificial layer with water comprises at least a portion of the sacrificial layer remaining on one side of the display unit.

* * * * *